(12) United States Patent
Inoue et al.

(10) Patent No.: US 11,328,911 B2
(45) Date of Patent: May 10, 2022

(54) OXIDE SINTERED BODY AND SPUTTERING TARGET

(71) Applicant: IDEMITSU KOSAN CO., LTD., Tokyo (JP)

(72) Inventors: Kazuyoshi Inoue, Sodegaura (JP); Shigekazu Tomai, Sodegaura (JP); Masatoshi Shibata, Sodegaura (JP); Motohiro Takeshima, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 396 days.

(21) Appl. No.: 16/310,388

(22) PCT Filed: Jun. 16, 2017

(86) PCT No.: PCT/JP2017/022276
§ 371 (c)(1),
(2) Date: Mar. 28, 2019

(87) PCT Pub. No.: WO2017/217529
PCT Pub. Date: Dec. 21, 2017

(65) Prior Publication Data
US 2019/0218145 A1      Jul. 18, 2019

(30) Foreign Application Priority Data

Jun. 17, 2016   (JP) .............................. JP2016-121063

(51) Int. Cl.
*H01J 37/34*     (2006.01)
*C23C 14/34*     (2006.01)
(Continued)

(52) U.S. Cl.
CPC .......... *H01J 37/3429* (2013.01); *C04B 35/01* (2013.01); *C23C 14/08* (2013.01);
(Continued)

(58) Field of Classification Search
CPC ................ C23C 14/3414; C23C 14/08; C23C 14/086; C23C 14/3407; H01J 37/3426;
(Continued)

(56) References Cited

U.S. PATENT DOCUMENTS

| | | | |
|---|---|---|---|
| 2007/0091950 | A1 | 4/2007 | Takata et al. |
| 2010/0108502 | A1 | 5/2010 | Inoue et al. |
| 2014/0001040 | A1 | 1/2014 | Inoue et al. |
| 2014/0339073 | A1 | 11/2014 | Inoue et al. |

(Continued)

FOREIGN PATENT DOCUMENTS

| | | |
|---|---|---|
| CN | 103320755 A | 9/2013 |
| JP | S62-072597 A | 4/1987 |

(Continued)

OTHER PUBLICATIONS

Skaudzius, R.; Seiskis, A.; Pinkas, J.; Kareiva, A. "Synthesis and evolution of crystalline garnet phases in Y3Al5—xlnxO12". Journal of Physics: Conference series 93. (Year: 2007).*
International Search Report dated Sep. 5, 2017 in corresponding application No. PCT/JP2017/022276.
Translation of the Written Opinion of the International Searching Authority dated Dec. 27, 2018 in corresponding application No. PCT/JP2017/022276.

(Continued)

*Primary Examiner* — Michael A Band
(74) *Attorney, Agent, or Firm* — Foley & Lardner LLP

(57) ABSTRACT

An oxide sintered body includes a bixbyite phase represented by $In_2O_3$, and a garnet phase represented by $Y_3In_2Ga_3O_{12}$.

12 Claims, 2 Drawing Sheets

(51) Int. Cl.
*C23C 14/08* (2006.01)
*C04B 35/01* (2006.01)
*C04B 35/64* (2006.01)
*H01L 29/66* (2006.01)

(52) U.S. Cl.
CPC .......... *C23C 14/083* (2013.01); *C23C 14/086* (2013.01); *C23C 14/3407* (2013.01); *C23C 14/3414* (2013.01); *H01L 29/66969* (2013.01); *C04B 35/64* (2013.01); *C04B 2235/3225* (2013.01); *C04B 2235/3286* (2013.01); *C04B 2235/3293* (2013.01); *C04B 2235/604* (2013.01); *C04B 2235/6562* (2013.01); *C04B 2235/6567* (2013.01); *C04B 2235/761* (2013.01); *C04B 2235/764* (2013.01); *C04B 2235/786* (2013.01); *C04B 2235/80* (2013.01); *C04B 2235/9607* (2013.01)

(58) Field of Classification Search
CPC ................ H01J 37/3429; C04B 35/01; C04B 2235/3225; C04B 2235/80
See application file for complete search history.

(56) References Cited

U.S. PATENT DOCUMENTS

2016/0343554 A1 11/2016 Tomai et al.
2019/0177176 A1* 6/2019 Inoue .................... C23C 14/34

FOREIGN PATENT DOCUMENTS

| JP | 09-209134 A | 8/1997 |
| JP | 2000-169219 A | 6/2000 |
| TW | 200728436 A | 8/2007 |
| TW | 201533005 A | 9/2015 |
| WO | WO-2010/032432 A1 | 3/2010 |
| WO | WO-2015/098060 A1 | 7/2015 |

OTHER PUBLICATIONS

Office Action dated Oct. 8, 2020 for corresponding Taiwanese Patent Application No. 106120191.

Xianfeng, et al., "Synthesis of Garnet $Gd_3In_2Ga_3O_{12}$ under High Pressure", Chinese Science Bulletin, 41(5): 418-421 (1996), Machine Translation, (8 pages).

* cited by examiner

OXIDE SINTERED BODY AND SPUTTERING TARGET

CROSS-REFERENCE TO RELATED APPLICATIONS

The present application is a U.S. National Stage Application claiming the benefit of International Patent Application No. PCT/JP2017/022276, filed Jun. 16, 2017, which claims the benefit of priority to Japanese Patent Application No. 2016-121063, filed Jun. 17, 2016, the disclosures of which are hereby incorporated by reference.

TECHNICAL FIELD

The invention relates to an oxide sintered body and a sputtering target.

BACKGROUND ART

An amorphous (non-crystalline) oxide semiconductor used for a thin film transistor (TFT) has higher carrier mobility, and a larger optical band gap, and can be formed into a film at a lower temperature, in comparison with general-purpose amorphous silicon (a-Si), and therefore is expected to be applied to a next-generation display requiring a large size, high resolution and high-speed drive, a resin substrate having low heat resistance, and the like.

In forming the above-described oxide semiconductor (film), a sputtering process of sputtering a sputtering target is preferably used. The reason is that a thin film formed according to the sputtering process is superior in in-plane uniformity of a component composition, a film thickness or the like in a film surface direction (inside a film surface) to a thin film formed according to an ion plating process, a vacuum vapor deposition process and an electron beam deposition process, and the thin film having the same component composition with the sputtering target can be formed.

Patent Document 1 describes that an oxide sintered body composed of In, Y and O and having 2.0 to 40 atom % in Y/(Y+In) in terms of an atom concentration and having a volume resistivity of $5\times10^{-2}$ Ω·cm or less is used as a sputtering target. Moreover, Patent Document 1 describes that, as a content of a Sn element, Sn/(In+Sn+all other metal atoms) is 2.8 to 20 atom % in terms of the atom concentration.

Patent Document 2 describes an oxide sintered body composed of In, Sn, Y and O and having 0.1 to 2.0 atom % in Y/(In+Sn+Y) in terms of an atom concentration, and a sputtering target using the same.

Patent Document 3 describes a sintered body having an intermediate lattice constant between lattice constants of $YInO_3$ and $In_2O_3$, and use of the sintered body as a sputtering target.

Patent Document 4 describes a sputtering target containing a compound having an $A_3B_5O_{12}$ type garnet structure, obtained by sintering a raw material containing indium oxide, yttrium oxide and aluminum oxide or gallium oxide.

RELATED ART DOCUMENT

Patent Documents

Patent Document 1: JP-A-H09-209134
Patent Document 2: JP-A-2000-169219
Patent Document 3: WO2010/032432
Patent Document 4: WO2015/098060

SUMMARY OF THE INVENTION

An objective of the invention is to provide a new oxide sintered body and a new sputtering target.

As described in Patent Document 4, a compound composed of yttrium oxide and gallium oxide has been considered so far to include an $A_3B_5O_{12}$ type garnet phase. However, the present inventors have diligently conducted research, and as a result, have found out that a garnet phase represented by $Y_3In_2Ga_3O_{12}$ appears in an oxide sintered body including a bixbyite phase represented by $In_2O_3$ as a main component instead of the $A_3B_5O_{12}$ type garnet phase, and have completed the invention.

According to the invention, an oxide sintered body, a sputtering target and the like described below are provided.

1. An oxide sintered body, including a bixbyite phase represented by $In_2O_3$, and a garnet phase represented by $Y_3In_2Ga_3O_{12}$.
2. The oxide sintered body according to 1, wherein an atomic ratio of In, Ga and Y is in the following range:
    0.60 or more and 0.97 or less in In/(In+Y+Ga);
    0.01 or more and 0.20 or less in Ga/(In+Y+Ga); and
    0.02 or more and 0.20 or less in Y/(In+Y+Ga).
3. The oxide sintered body according to 1 or 2, wherein a peak intensity ratio of maximum peak intensity of the bixbyite phase represented by $In_2O_3$ to maximum peak intensity of the garnet phase represented by $Y_3In_2Ga_3O_{12}$ is 1 to 500.
4. The oxide sintered body according to any one of 1 to 3, further including a positive tetravalent metal element.
5. The oxide sintered body according to 4, wherein the positive tetravalent metal element forms solid solution with the bixbyite phase represented by $In_2O_3$ or the garnet phase represented by $Y_3In_2Ga_3O_{12}$.
6. The oxide sintered body according to 4 or 5, wherein a content of the positive tetravalent metal element is 100 to 10000 ppm, in terms of an atom concentration, based on all metal elements in the oxide sintered body.
7. The oxide sintered body according to any one of 4 to 6, wherein the positive tetravalent metal element is Sn.
8. The oxide sintered body according to any one of 1 to 7, wherein the oxide sintered body has a relative density of 95% or more.
9. The oxide sintered body according to any one of 1 to 8, wherein the oxide sintered body has a bulk resistance of 30 mΩ·cm or less.
10. A sputtering target, including the oxide sintered body according to any one of 1 to 9.
11. A method for manufacturing an oxide semiconductor thin film, comprising using the sputtering target according to 10.
12. A method for manufacturing a thin film transistor including the oxide semiconductor thin film according to 11.

According to the invention, a new oxide sintered body and a new sputtering target can be provided.

MODE FOR CARRYING OUT THE INVENTION

Figure 1:
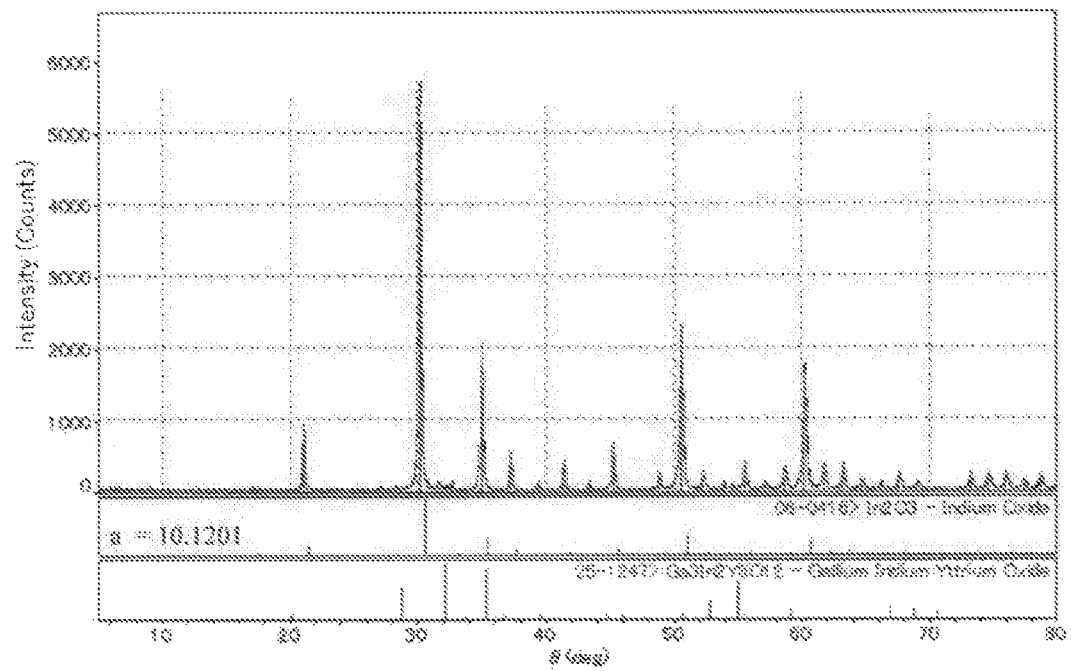
FIG. 1 shows an X-ray diffraction pattern of an oxide sintered body in Example 1.

An oxide sintered body of the invention includes a bixbyite phase represented by $In_2O_3$, and a garnet phase represented by $Y_3In_2Ga_3O_{12}$.

Accordingly, improvement in sintered body density (relative density) and reduction of volume resistivity (bulk resistance) can be achieved. Moreover, a coefficient of linear expansion can be reduced and thermal conductivity can be increased. Moreover, even when calcination is performed under special conditions such as an oxygen atmosphere using an atmosphere calcination furnace, or according to such a simple method as performing the calcination under the atmosphere, the sintered body having low volume resistivity and high sintered body density can be formed.

According to the sintered body (oxide sintered body) of the invention, a sputtering target (target) having high strength can be obtained, and the sputtering target capable of sputtering with large power without generating a micro crack by thermal stress, and without causing chipping or abnormal discharge can be obtained.

In the sintered body of the invention, strength of the target is high. Moreover, thermal conductivity is high and a coefficient of linear expansion is small, and therefore the thermal stress can be suppressed. As a result, generation of the micro crack or chipping of the target can be suppressed, and generation of a nodule or the abnormal discharge can be suppressed.

In addition thereto, according to the sintered body of the invention, a high performance TFT can be obtained, in which the TFT has high mobility, and small deterioration of characteristics by heat in a chemical vapor deposition process (CVD process) performed after lamination of an oxide semiconductor layer in the course of a TFT manufacturing process, or in a heat treatment after TFT preparation, and the like.

The bixbyite phase represented by $In_2O_3$ and the garnet phase represented by $Y_3In_2Ga_3O_{12}$ can be detected from an XRD chart according to an X-ray diffraction (XRD) method, for example.

In the sintered body of the invention, the bixbyite phase represented by $In_2O_3$ is preferably a main component.

A peak intensity ratio ($In_2O_3/Y_3In_2Ga_3O_{12}$) of maximum peak intensity of the bixbyite phase represented by $In_2O_3$ to maximum peak intensity of the garnet phase represented by $Y_3In_2Ga_3O_{12}$ is preferably 1 to 500, more preferably 5 to 300, and further preferably 7 to 290.

Stable sputtering can be performed by keeping the peak intensity ratio within the above-described range.

The peak intensity ratio ($In_2O_3/Y_3In_2Ga_3O_{12}$) of the maximum peak intensity of the bixbyite phase represented by $In_2O_3$ to the maximum peak intensity of the garnet phase represented by $Y_3In_2Ga_3O_{12}$ can be calculated from measurement of XRD, for example.

Specifically, the peak intensity ratio can be determined by using peak intensity ($2\theta/\theta$=about 30 to 31°, for example, 29.5 to 31°) at which a maximum peak of the bixbyite phase represented by $In_2O_3$ appears, and peak intensity ($2\theta/\theta$=about 32°, for example, 31.1 to 32.5°) at which a maximum peak of the garnet phase represented by $Y_3In_2Ga_3O_{12}$ appears, and dividing the peak intensity at which the maximum peak of the bixbyite phase represented by $In_2O_3$ appears by the peak intensity at which the maximum peak of the garnet phase represented by $Y_3In_2Ga_3O_{12}$ appears.

Y or Ga or Y and Ga may form solid solution with the bixbyite phase represented by $In_2O_3$. Y and Ga preferably form the solid solution with the bixbyite phase represented by $In_2O_3$. The solid solution is preferably substitutional solid solution.

Accordingly, stable sputtering can be performed.

The formation of solid solution of Y or Ga, or Y and Ga can be identified from a lattice constant of the bixbyite phase by using the measurement of XRD, for example.

If the lattice constant of the bixbyite phase represented by $In_2O_3$ is smaller than a lattice constant of only the bixbyite phase represented by $In_2O_3$, the formation of solid solution of Ga dominantly acts thereon, and if the lattice constant of the bixbyite phase represented by $In_2O_3$ is larger than the lattice constant of only the bixbyite phase represented by $In_2O_3$, the formation of solid solution of Y dominantly acts thereon.

Here, a term "lattice constant" is defined as a length of a lattice axis of a unit lattice, and can be determined according to the X-ray diffraction method, for example.

Moreover, Y, In or Ga, or Y, In and Ga may form solid solution in each site forming the garnet phase represented by $Y_3In_2Ga_3O_{12}$.

Formation of the solid solution of the metal elements can be confirmed by the fact that the composition of the garnet phase included in the oxide sintered body slightly deviated from a composition represented by $Y_3In_2Ga_3O_{12}$. Specifically, the formation can be confirmed by Rietveld analysis.

Accordingly, stable sputtering can be performed.

A mean particle size of the garnet phase represented by $Y_3In_2Ga_3O_{12}$ is preferably 15 μm or less, more preferably 10 μm or less, further preferably 8 μm or less, and particularly preferably 5 μm or less. A lower limit is not particularly limited, but is ordinarily 0.1 μm or more.

When the mean particle size of the garnet phase represented by $Y_3In_2Ga_3O_{12}$ is 15 μm or less, discharge is easily stabilized.

The mean particle size of the garnet phase represented by $Y_3In_2Ga_3O_{12}$ can be determined by identifying the garnet phase represented by $Y_3In_2Ga_3O_{12}$ by means of an electron probe microanalyzer (EPMA), assuming a circle having a maximum diameter thereof as a diameter, and being taken as a mean value of the diameters, for example.

An atomic ratio: In/(In+Y+Ga) of an In element to the In element, a Y element and a Ga element included in the oxide sintered body is preferably 0.60 or more and 0.97 or less, more preferably 0.70 or more and 0.96 or less, and further preferably 0.75 or more and 0.95 or less.

When the ratio: In/(In+Y+Ga) is less than 0.60, mobility of the TFT including an oxide semiconductor thin film to be formed is liable to be reduced. When the ratio: In/(In+Y+Ga) is more than 0.97, stability of the TFT is liable to be unable to be obtained, or the TFT is conducted, and is liable to be hard to form a semiconductor.

An atomic ratio: Ga/(In+Y+Ga) of the Ga element to the In element, the Y element and the Ga element included in the oxide sintered body is preferably 0.01 or more and 0.20 or less, more preferably 0.02 or more and 0.15 or less, and further preferably 0.02 or more and 0.12 or less.

When the ratio: Ga/(In+Y+Ga) is less than 0.01, the garnet phase represented by $Y_3In_2Ga_3O_{12}$ is not formed, the bulk resistance of the sintered body may be increased, the sintered body density and sintered body strength may be reduced, and therefore cracking or the like by heat during sputtering may be easily caused, or stable sputtering is liable to be unable to be performed. On the other hand, when the ratio: Ga/(In+Y+Ga) is more than 0.20, the mobility of the TFT including the oxide semiconductor thin film to be formed is liable to be reduced.

An atomic ratio: Y/(In+Y+Ga) of the Y element to the In element, the Y element and the Ga element included in the oxide sintered body is preferably 0.02 or more and 0.20 or less, more preferably 0.02 or more and 0.18 or less, and further preferably 0.03 or more and 0.16 or less.

When the ratio: Y/(In+Y+Ga) is less than 0.02, the garnet phase represented by $Y_3In_2Ga_3O_{12}$ is not formed, the bulk resistance of the sintered body may be increased, the sintered body density and the sintered body strength may be reduced, and therefore cracking or the like by heat during sputtering may be easily caused, or stable sputtering is liable to be unable to be performed. On the other hand, when the ratio: Y/(In+Y+Ga) is more than 0.20, the mobility of the TFT including the oxide semiconductor thin film to be formed is liable to be reduced.

The oxide sintered body of the invention preferably further includes a positive tetravalent metal element.

Accordingly, sputtering can be further stably performed.

Specific examples of the positive tetravalent metal element include Sn, Ti, Zr, Hf, Ce and Ge.

Among the above-described positive tetravalent metal elements, Sn is preferred. The bulk resistance is reduced by a doping effect of Sn, and sputtering can be further stably performed.

The positive tetravalent metal element preferably forms solid solution with the bixbyite phase represented by $In_2O_3$ or the garnet phase represented by $Y_3In_2Ga_3O_{12}$, and more preferably forms the solid solution with the bixbyite phase represented by $In_2O_3$. The solid solution is preferably substitutional solid solution.

Accordingly, sputtering can be further stably performed.

The forming of solid solution of the positive tetravalent metal element can be identified from the bulk resistance of the oxide sintered body, for example. The bulk resistance of the oxide sintered body when the positive tetravalent metal element is not added thereto or does not form the solid solution is high to cause the abnormal discharge in several cases. When the positive tetravalent metal element is added thereto and forms the solid solution, the bulk resistance of the oxide sintered body is reduced, and a stable sputtering state can be obtained.

A content of the positive tetravalent metal element is preferably 100 to 10000 ppm, more preferably 500 ppm or more and 8000 ppm or less, and further preferably 800 ppm or more and 6000 ppm or less, in terms of an atom concentration, based on all metal elements in the oxide sintered body.

When the content of the positive tetravalent metal element is less than 100 ppm, the bulk resistance is liable not to be reduced. On the other hand, when the content of the positive tetravalent metal element is more than 10000 ppm, the oxide semiconductor thin film to be formed stays in a high carrier state, and the TFT is liable to be conducted or an ON/OFF value is liable to be decreased.

In the oxide sintered body of the invention, the relative density is preferably 95% or more, more preferably 96% or more, further preferably 97% or more, and particularly preferably 98% or more. An upper limit is not particularly limited, but is ordinarily 100%.

When the relative density of the oxide sintered body is 95% or more, a space causing the abnormal discharge or serving as a starting point of generation of the nodule can be reduced upon using the oxide sintered body as the target.

The relative density can be determined by calculating a value obtained by dividing measured density of the oxide sintered body measured according to an Archimedes method by theoretical density of the oxide sintered body, and expressing the value in terms of percentage, for example.

For example, in the case where oxide A, oxide B, oxide C and oxide D are used as raw material powder of the oxide sintered body, when a use amount (charge amount) of oxide A, oxide B, oxide C and oxide D is taken as a (g), b (g), c (g) and d (g), respectively, the theoretical density can be calculated by applying the values to an equation as described below.

(Theoretical density)=$(a+b+c+d)/\{(a/$density of oxide $A)+(b/$density of oxide $B)+(c/$density of oxide $C)+(d/$density of oxide $D)\}$ In addition, as the density of each oxide, the density is substantially comparable to specific gravity, and therefore a value of oxide described in Handbook of Chemistry: Pure Chemistry I, the Chemical Society of Japan, 2nd edition, (Maruzen Co., Ltd.) should be used. In addition, the theoretical density can also be calculated by using a weight ratio of each oxide as described below.

(Theoretical density)=$1/\{($weight ratio of oxide $A/$density of oxide $A)+($weight ratio of oxide $B/$density of oxide $B)+($weight ratio of oxide $C/$density of oxide $C)+($weight ratio of oxide $D/$density of oxide $D)\}$ In the oxide sintered body of the invention, the bulk resistance is preferably 30 mΩ·cm or less, more preferably 15 mΩ·cm or less, and further preferably 10 mΩ·cm or less. A lower limit is not particularly limited, but is ordinarily 1 mΩ·cm or more.

When the bulk resistance of the oxide sintered body is 30 mΩ·cm or less, the abnormal discharge by charging of the target is hard to be generated during film formation with large power, and a plasma state is stabilized, and spark becomes hard to be generated. Moreover, when a pulse DC sputtering device is used, plasma is further stabilized, and a problem of the abnormal discharge or the like is not posed, and sputtering can be stably performed.

The bulk resistance can be measured on the basis of a four-point probe array, for example.

In the oxide sintered body of the invention, three-point flexural strength is preferably 120 MPa or more, more preferably 140 MPa or more, and further preferably 150 MPa or more.

When the three-point flexural strength of the oxide sintered body is less than 120 MPa, strength of the target is low upon performing film formation by sputtering with large power, and the target may be cracked or chipped, and chipped fragments may be scattered on the target, which is liable to cause the abnormal discharge.

The three-point flexural strength can be tested in accordance with JIS R 1601 "Testing method for flexural strength (modulus of rupture) of fine ceramics at room temperature", for example.

Specifically, the flexural strength can be calculated from a maximum load when a test piece is broken by using a standard test piece having a width of 4 mm, a thickness of 3 mm and a length of 40 mm, placing the test piece on two supporting points arranged at a predetermined distance (30 mm), and applying a load from a center between the supporting points at a crosshead speed of 0.5 mm/min.

In the oxide sintered body of the invention, the coefficient of linear expansion is preferably $9.0 \times 10^{-6}$ $K^{-1}$ or less, more preferably $8.5 \times 10^{-6}$ $K^{-1}$ or less, and further preferably $8.0 \times 10^{-6}$ $K^{-1}$ or less. A lower limit is not particularly limited, but is ordinarily $5.0 \times 10^{-6}$ $K^{-1}$ or more.

When the coefficient of linear expansion of the oxide sintered body is more than $9.0 \times 10^{-6}$ $K^{-1}$, the target is heated during sputtering with large power, and the target is expanded and deformed between the target and a side of a cupper plate to which the target is bonded, and the micro crack may be caused by stress, or cracking or chipping is liable to cause the abnormal discharge.

The coefficient of linear expansion can be determined by using a standard test piece having a width of 5 mm, a thickness of 5 mm and a length of 10 mm, setting a heating rate to 5° C./min, and detecting deflection by thermal expansion when temperature reaches 300° C. by means of a position detector, for example.

In the oxide sintered body of the invention, the thermal conductivity is preferably 5.0 W/m·K or more, more preferably 5.5 W/m·K or more, further preferably 6.0 W/m·K or more, and most preferably 6.5 W/m·K or more.

An upper limit is not particularly limited, but is ordinarily 10 W/m·K or less.

When the thermal conductivity of the oxide sintered body is less than 5.0 W/m·K, a temperature on a sputtered surface is different from a temperature on a bonded surface upon performing film formation by sputtering with large power, and the micro crack, cracking or chipping is liable to be caused by internal stress in the target.

The thermal conductivity can be calculated by using a standard test piece having a diameter of 10 mm and a thickness of 1 mm, and determining, according to a laser flash method, specific heat capacity and thermal diffusivity, and multiplying the resulting values by density of the test piece, for example.

In the oxide sintered body of the invention, a Young's modulus is preferably 200 GPa or less, more preferably 190 GPa or less, further preferably 185 GPa or less, and most preferably 180 GPa or less.

A lower limit of the Young's modulus is not particularly limited, but is ordinarily 100 GPa or more.

If the Young's modulus of the oxide sintered body is 200 GPa or less, the target is not cracked even by the thermal stress generated during sputtering, and such a case is preferred.

The Young's modulus can be determined by measurement of sound velocity according to an ultrasonic pulse echo method, for example.

The oxide sintered body of the invention essentially consists of In, Y, Ga and arbitrarily the positive tetravalent metal element, and may include inevitable impurities in addition thereto in a range in which advantageous effects of the invention are not adversely affected.

For example, the oxide sintered body may be composed of In, Y and Ga, or In, Y, Ga and the positive tetravalent metal element in 90 atom % or more, 95 atom % or more, 98 atom % or more, 99 atom % or more or 100 atom % of the metal elements of the oxide sintered body of the invention.

The oxide sintered body of the invention only needs to include, as a crystalline phase, the bixbyite phase represented by $In_2O_3$ and the garnet phase represented by $Y_3In_2Ga_3O_{12}$, or may consist essentially of these crystalline phases.

The oxide sintered body of the invention can be manufactured according to a step of preparing mixed powder of raw material powder including the In element, raw material powder including the Y element and raw material powder including the Ga element, a step of molding the mixed powder to manufacture a molded body, and a step of calcining the molded body.

The mixed powder may contain raw material powder including the positive tetravalent metal element.

The raw material powder is preferably oxide powder. More specifically, the raw material powder including the In element is preferably indium oxide powder, the raw material powder including the Y element is preferably yttrium oxide powder, and the raw material powder including the Ga element is preferably gallium oxide powder. The raw material powder including the positive tetravalent metal element is preferably oxide powder of the positive tetravalent metal element, and above all, tin oxide powder is preferred.

A mixing ratio of the raw material powder is allowed to correspond to an atomic ratio of the sintered body tried to be obtained, for example.

A mean particle size of the raw material powder is preferably 0.1 to 1.2 μm, and more preferably 0.5 to 1.0 μm or less. The mean particle size of the raw material powder can be measured by a laser diffraction particle size distribution device or the like.

A method for mixing or molding the raw materials is not particularly limited, and mixing or molding can be performed by using a publicly-known method. Moreover, a binder may be added thereto upon mixing the raw materials.

The raw materials can be mixed by using publicly-known equipment such as a ball mill, a bead mill, a jet mill or ultrasonic equipment, for example. A milling time may be appropriately adjusted, but is preferably about 6 to 100 hours.

As a molding method, the mixed powder can be press-molded into the molded body, for example. According to the above step, the mixed powder can be molded into a shape of a product (for example, the shape preferable as the sputtering target).

The molded body can be obtained by filling the raw materials into a mold, and molding the raw materials at a pressure of 1000 kg/cm$^2$ or more, for example, by ordinarily using a mold press or a cold isostatic press (CIP).

In addition, upon molding processing, a molding aid such as polyvinyl alcohol, polyethylene glycol, methyl cellulose, poly wax, oleic acid and stearic acid may be used.

The sintered body can be obtained by sintering the molded body obtained at a sintering temperature of 1200 to 1650° C. for 10 hours or more, for example.

The sintering temperature is preferably 1350 to 1600° C., more preferably 1400 to 1600° C., and further preferably 1450 to 1600° C. A sintering time is preferably 10 to 50 hours, more preferably 12 to 40 hours, and further preferably 13 to 30 hours.

If the sintering temperature is less than 1200° C. or the sintering time is less than 10 hours, sintering does not sufficiently progress, and therefore electrical resistance of the target is not sufficiently reduced, and is liable to cause the abnormal discharge. On the other hand, if the sintering temperature is more than 1650° C. or the sintering time is more than 50 hours, a mean crystal grain size may be increased by remarkable crystal grain growth or coarse pores may be generated, which is liable to cause reduction of the sintered body strength, or the abnormal discharge.

In an atmospheric sintering method, the molded body is ordinarily sintered under the atmosphere or an oxygen gas atmosphere. The oxygen gas atmosphere is preferably an atmosphere in which an oxygen concentration is 10 to 50% by volume, for example. Even if a heating process is performed under the atmosphere, the sintered body density can be increased.

Further, the heating rate upon sintering the molded body is preferably adjusted to 50 to 150° C./hour from 800° C. to the sintering temperature (1200 to 1650° C.).

In the oxide sintered body of the invention, a temperature range from 800° C. or more is a range in which sintering most progresses. If the heating rate in the above temperature range becomes lower than 50° C./hour, crystal grain growth becomes remarkable, and high density is liable to be unable to be achieved. On the other hand, if the heating rate becomes higher than 150° C./hour, a temperature distribution is caused in the molded body, and the sintered body is liable to be warped or cracked.

The heating rate from 800° C. to the sintering temperature is preferably 60 to 140° C./hour, and more preferably 70 to 130° C./hour.

The sputtering target of the invention can be prepared by using the above-described oxide sintered body. Accordingly, the oxide semiconductor thin film can be manufactured according to a vacuum process such as a sputtering process.

For example, the sputtering target can be prepared by cutting or polishing the sintered body, and bonding the resulting material to a backing plate.

For example, a sintered portion in a highly oxidized state or an uneven surface on a surface of the sintered body can be removed by cutting the sintered body. Moreover, the target can be processed into a specified size.

The surface may be polished with Buff #200 or #400 and #800. Accordingly, generation of the abnormal discharge or particles during sputtering can be suppressed.

Specific examples of a bonding method include bonding by metal indium.

The sputtering target of the invention can be applied to a direct current (DC) sputtering process, a radio frequency (RF) sputtering process, an alternating current (AC) sputtering process, a pulse DC sputtering process or the like.

The oxide semiconductor thin film can be obtained by forming a film by using the above-described sputtering target. Accordingly, the thin film in which excellent TFT performance is exhibited upon being used for the TFT can be formed.

The film can be formed according to a vapor deposition process, a sputtering process, an ion plating process, a pulsed laser vapor deposition process or the like.

The TFT of the invention includes the above-described oxide semiconductor thin film. The oxide semiconductor thin film can be preferably used as a channel layer, for example.

A device construction of the TFT is not particularly limited, and various publicly-known device constructions can be adopted. The TFT of the invention can be used for a display unit for a liquid crystal display, an organic electroluminescence display, or the like, for example.

Figure 3:
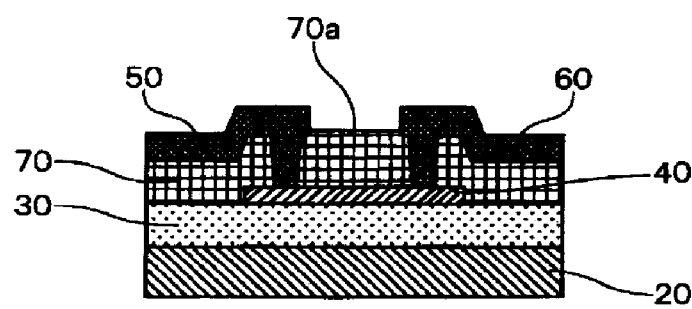
FIG. 3 is a diagram showing one embodiment of a TFT of the invention.

One example of the TFT of the invention is shown in FIG. 3. In the TFT, a semiconductor film 40 obtained using the sputtering target of the invention is formed on a gate insulating film 30 on a silicon wafer (gate electrode) 20, and interlayer insulating films 70 and 70a are formed thereon. The interlayer insulating film 70a on the semiconductor film 40 acts also as a channel layer protective layer. A source electrode 50 and a drain electrode 60 are provided on the semiconductor film.

Figure 4:
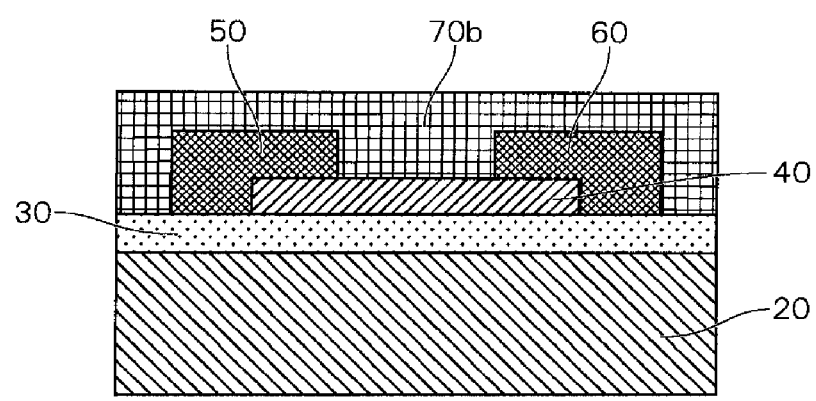
FIG. 4 is a diagram showing one embodiment of a TFT of the invention.

One example of the TFT of the invention is shown in FIG. 4. In the TFT, a semiconductor film 40 obtained using the sputtering target of the invention is formed on a gate insulating film (for example, $SiO_2$) 30 on a silicon wafer (gate electrode) 20, and a source electrode 50 and a drain electrode 60 are provided on the semiconductor film 40, and a protective layer 70b (for example, a $SiO_2$ film formed according to CVD) is provided on the semiconductor film 40, the source electrode 50 and the drain electrode 60.

With regard to the silicon wafer 20 and the gate insulating film 30, the silicon wafer may be applied as the gate electrode by using a silicon wafer with a thermal oxide film, and the thermal oxide film ($SiO_2$) may be applied as the gate insulating film.

Moreover, in FIG. 3 and FIG. 4, the gate electrode 20 may be formed on a substrate such as glass.

In the semiconductor film, a band gap is preferably 3.0 eV or more. When the band gap is 3.0 eV or more, the semiconductor film does not absorb light having a wavelength on side of a longer wavelength from about 420 nm. Accordingly, the semiconductor film does not absorb light from a light source of an organic EL or a TFT-LCD, and upon being used as the channel layer of the TFT, malfunction of the TFT by light, or the like is not caused, and light stability can be improved. The band gap is preferably 3.1 eV or more, and more preferably 3.3 eV or more.

In the TFT of the invention, a material forming each electrode of the drain electrode, the source electrode and the gate electrode is not particularly limited, and the material generally used can be arbitrarily selected. For example, a transparent electrode formed of indium tin oxide (ITO), indium oxide zinc (IZO), ZnO, $SnO_2$ or the like, a metal electrode formed of Al, Ag, Cu, Cr, Ni, Mo, Au, Ti, Ta or the like, or a metal electrode or a laminated electrode of alloy containing the above materials can be used. Moreover, the silicon wafer may be used as the substrate, and in the case, the silicon wafer acts also as the electrode.

In the TFT of the invention, in the case of a TFT of a back channel etch type (bottom gate type), the protective film is preferably provided on the drain electrode, the source electrode and the channel layer. Durability is easily improved by providing the protective film thereon even when the TFT is driven for a long period of time. In addition, in the case of a TFT of a top gate type, the TFT is formed into a structure in which the gate insulating film is formed on the channel layer, for example.

The protective film or the insulating film can be formed according to CVD, for example, and on the occasion, a process by a high temperature is applied in several cases. Moreover, the protective film or the insulating film includes impurity gas immediately after film formation in many cases, and heat treatment (annealing) is preferably performed. A stable protective film or insulating film is formed by removing the impurity gas by the heat treatment, and the TFT device having high durability is easily formed.

The TFT becomes less susceptible to temperature in the CVD process and the heat treatment thereafter by using the oxide semiconductor thin film of the invention, and therefore even when the protective film or the insulating film is formed, stability of TFT characteristics can be improved.

EXAMPLES

Hereinafter, the invention will be described using Examples. However, the invention is not limited to these Examples.

Examples 1 to 14

(Manufacture of Oxide Sintered Body)

Indium oxide powder, gallium oxide powder, yttrium oxide powder and tin oxide powder were weighed to be an atomic ratio and a Sn atom concentration of an oxide sintered body shown in Tables 1 and 2, put in a pot made of polyethylene, and mixed and milled for 72 hours by using a dry ball mill to prepare mixed powder.

The resulting mixed powder was put in a mold and formed into a press-molded body at a pressure of 500 kg/cm$^2$. The resulting molded body was densified at a pressure of 2000 kg/cm$^2$ by CIP. Next, the resulting molded body was placed in an atmospheric calcination furnace, held at 350° C. for 3 hours under the atmosphere, and then heated at 100° C./hour, and sintered at 1450° C. for 20 hours, and then cooled by being left to stand to obtain an oxide sintered body (sintered body).

(Measurement of XRD)

X-ray diffraction (XRD) of the sintered body was measured, on the sintered body obtained, by means of X-ray Diffractometer Smartlab under the following conditions. An XRD chart obtained was analyzed according to JADE 6 to determine a crystalline phase in the sintered body. The results are shown in Tables 1 and 2. In Tables 1 and 2, "$In_2O_3$" indicates a "bixbyite phase represented by $In_2O_3$", and "$Y_3In_2Ga_3O_{12}$" indicates a "garnet phase represented by $Y_3In_2Ga_3O_{12}$".

Diffractometer: Smartlab (made by Rigaku Corporation)
X-rays: Cu-Kα rays (wavelength: 1.5418 Å, monochromatization by a graphite monochromator)
2θ-θ reflection method, serial scan (2.0°/min)
Sampling interval: 0.02°
Slit DS (divergence slit), SS (scattering slit), RS (receiving slit): 1.0 mm An XRD chart of a sintered body obtained in Example 1 is shown in FIG. 1. In FIG. 1, a part having intensity of 5500 or more was omitted.

From FIG. 1, the sintered body in Example 1 was found to have the "bixbyite phase represented by $In_2O_3$", and the "garnet phase represented by $Y_3In_2Ga_3O_{12}$".

Figure 2:
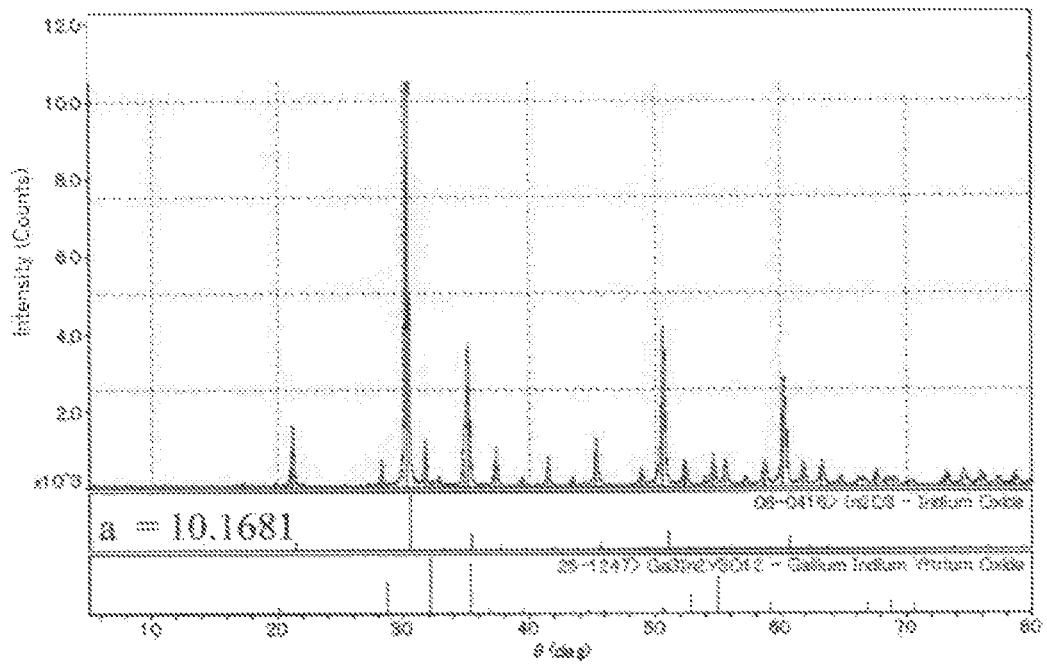
FIG. 2 shows an X-ray diffraction pattern of an oxide sintered body in Example 12.

Moreover, an XRD chart of the sintered body obtained in Example 12 is shown in FIG. 2. In FIG. 2, a part having intensity of 10500 or more was omitted. From FIG. 2, the sintered body in Example 12 was found to have the "bixbyite phase represented by $In_2O_3$", and the "garnet phase represented by $Y_3In_2Ga_3O_{12}$".

Intensity of a maximum peak (2θ/θ=about 30 to 31°) of the bixbyite phase represented by $In_2O_3$ and intensity of a maximum peak (2θ/θ=about 32°) of the garnet phase represented by $Y_3In_2Ga_3O_{12}$ in FIG. 1 were used by excluding an influence of a base.

A peak intensity ratio ($In_2O_3/Y_3In_2Ga_3O_{12}$) of maximum peak intensity of the bixbyite phase represented by $In_2O_3$ to maximum peak intensity of the garnet phase represented by $Y_3In_2Ga_3O_{12}$ was determined by dividing the peak intensity at 2θ/θ=about 30 to 31° at which the maximum peak intensity of the bixbyite phase represented by $In_2O_3$ appears by the peak intensity at 2θ/θ=about 32° at which the maximum peak intensity of the garnet phase represented by $Y_3In_2Ga_3O_{12}$ appears.

In the sintered body in Example 1, the peak intensity ratio ($In_2O_3/Y_3In_2Ga_3O_{12}$) of the maximum peak intensity of the bixbyite phase represented by $In_2O_3$ to the maximum peak intensity of the garnet phase represented by $Y_3In_2Ga_3O_{12}$ was 71.09.

A peak intensity ratio was calculated from FIG. 2 in a similar manner. In the sintered body in Example 12, the peak intensity ratio ($In_2O_3/Y_3In_2Ga_3O_{12}$) of maximum peak intensity of the bixbyite phase represented by $In_2O_3$ to maximum peak intensity of the garnet phase represented by $Y_3In_2Ga_3O_{12}$ was 10.86.

In the above-described sintered bodies in Examples 2 to 11 and 13 to 14, a peak intensity ratio ($In_2O_3/Y_3In_2Ga_3O_{12}$) of maximum peak intensity of the bixbyite phase represented by $In_2O_3$ to maximum peak intensity of the garnet phase represented by $Y_3In_2Ga_3O_{12}$ was determined in a similar manner. The results are shown in Tables 1 and 2.

Moreover, from an XRD chart, the sintered bodies in Examples 2 to 11 and 13 to 14 were found to have the "bixbyite phase represented by $In_2O_3$", and the "garnet phase represented by $Y_3In_2Ga_3O_{12}$".

Moreover, a lattice constant of a bixbyite structure of the "bixbyite phase represented by $In_2O_3$" was determined from measurement of XRD. The results are shown in Tables 1 and 2.

From the lattice constants obtained, it was found that, in the sintered bodies in Examples 1 and 2, Y and Ga form solid solution with the bixbyite phase represented by $In_2O_3$, and in the sintered body in Example 1, the solid solution of Y dominantly acts thereon, and in the sintered body in Example 2, the solid solution of Ga dominantly acts thereon.

Moreover, from the lattice constants obtained, it was found that, in the sintered bodies in Examples 3 to 14, Y, Ga and Sn form solid solution with the bixbyite phase represented by $In_2O_3$.

(Measurement of Mean Particle Size of Garnet Phase Represented by $Y_3In_2Ga_3O_{12}$)

A mean particle size was measured on the above-described sintered body by identifying the garnet phase represented by $Y_3In_2Ga_3O_{12}$ in the sintered body in a visual field of 50 μm×50 μm by means of an electron probe microanalyzer (EPMA), assuming a circle (circumscribed circle) having a maximum diameter of the garnet phase as a diameter, and taking a mean value of the diameters of a plurality of garnet phases included in the sintered body as the mean particle size of the garnet phase. The results are shown in Tables 1 and 2.

(Measurement of Relative Density)

Relative density was determined on the above-described sintered body by calculating a value obtained by dividing measured density measured according to an Archimedes method by theoretical density calculated from density and a weight ratio of oxide of each constituent element, and expressing the value in terms of percentage. The results are shown in Tables 1 and 2.

In addition, as density of each raw material powder, the density is substantially comparable to specific gravity, and therefore a value of oxide described in Handbook of Chemistry: Pure Chemistry I, the Chemical Society of Japan, 2nd edition, (Maruzen Co., Ltd.) was used.

(Measurement of Bulk Resistance)

Bulk resistance (conductivity) of the above-described sintered body was measured by using resistivity meter LORESTA (made by Mitsubishi Chemical Corporation, LORESTA-AX MCP-T370) on the basis of a four-point probe array (JIS R 1637). The results are shown in Tables 1 and 2.

TABLE 1

|  |  | Example 1 | Example 2 | Example 3 | Example 4 |
|---|---|---|---|---|---|
| Weight ratio of oxide | Indium oxide (% by weight) | 92.5 | 91.0 | 92.45 | 92.4 |
|  | Gallium oxide (% by weight) | 2.5 | 5.0 | 2.5 | 2.5 |
|  | Yttrium oxide (% by weight) | 5.0 | 4.0 | 5.0 | 5.0 |
|  | Tin oxide (% by weight) | 0.0 | 0.0 | 0.05 | 0.1 |
| Metal atomic ratio in oxide sintered body | In/(In + Ga + Y) | 0.904 | 0.881 | 0.904 | 0.904 |
|  | Ga/(In + Ga + Y) | 0.036 | 0.072 | 0.036 | 0.036 |
|  | Y/(In + Ga + Y) | 0.060 | 0.047 | 0.060 | 0.060 |
| Sn atom concentration based on all metal elements of oxide sintered body (ppm) |  | 0 | 0 | 450.0 | 900.0 |
| Crystalline phase in oxide sintered body |  | $In_2O_3 Y_3In_2Ga_3O_{12}$ | $In_2O_3 Y_3In_2Ga_3O_{12}$ | $In_2O_3 Y_3In_2Ga_3O_{12}$ | $In_2O_3 Y_3In_2Ga_3O_{12}$ |
| Peak intensity ratio |  | 71.09 | 30.41 | 83.73 | 47.63 |
| Lattice constant of bixbyite structure (Å) |  | 10.12010 | 10.10100 | 10.11670 | 10.12146 |
| Mean particle size of $Y_3In_2Ga_3O_{12}$ (µm) |  | 2.1 | 2.4 | 2.3 | 2.2 |
| Relative density (%) |  | 98.2 | 98.6 | 99.1 | 99.1 |
| Bulk resistance (mΩ · cm) |  | 9.8 | 7.4 | 7.4 | 4.1 |

|  |  | Example 5 | Example 6 | Example 7 |
|---|---|---|---|---|
| Weight ratio of oxide | Indium oxide (% by weight) | 92.0 | 93.5 | 89.5 |
|  | Gallium oxide (% by weight) | 2.5 | 2.0 | 2.0 |
|  | Yttrium oxide (% by weight) | 5.0 | 4.0 | 8.0 |
|  | Tin oxide (% by weight) | 0.5 | 0.5 | 0.5 |
| Metal atomic ratio in oxide sintered body | In/(In + Ga + Y) | 0.904 | 0.922 | 0.875 |
|  | Ga/(In + Ga + Y) | 0.036 | 0.029 | 0.029 |
|  | Y/(In + Ga + Y) | 0.060 | 0.049 | 0.096 |
| Sn atom concentration based on all metal elements of oxide sintered body (ppm) |  | 4501.4 | 4522.2 | 4481.8 |
| Crystalline phase in oxide sintered body |  | $In_2O_3 Y_3In_2Ga_3O_{12}$ | $In_2O_3 Y_3In_2Ga_3O_{12}$ | $In_2O_3 Y_3In_2Ga_3O_{12}$ |
| Peak intensity ratio |  | 63.25 | 111.19 | 116.16 |
| Lattice constant of bixbyite structure (Å) |  | 10.14129 | 10.13657 | 10.17041 |
| Mean particle size of $Y_3In_2Ga_3O_{12}$ (µm) |  | 2.5 | 2.1 | 1.9 |
| Relative density (%) |  | 99.4 | 98.9 | 99.3 |
| Bulk resistance (mΩ · cm) |  | 3.6 | 2.0 | 4.1 |

TABLE 2

|  |  | Example 8 | Example 9 | Example 10 | Example 11 |
|---|---|---|---|---|---|
| Weight ratio of oxide | Indium oxide (% by weight) | 85.5 | 90.5 | 87.5 | 90.5 |
|  | Gallium oxide (% by weight) | 2.0 | 3.0 | 4.0 | 5.0 |
|  | Yttrium oxide (% by weight) | 12.0 | 6.0 | 8.0 | 4.0 |
|  | Tin oxide (% by weight) | 0.5 | 0.5 | 0.5 | 0.5 |
| Metal atomic ratio in oxide sintered body | In/(In + Ga + Y) | 0.828 | 0.885 | 0.847 | 0.880 |
|  | Ga/(In + Ga + Y) | 0.029 | 0.043 | 0.058 | 0.072 |
|  | Y/(In + Ga + Y) | 0.143 | 0.072 | 0.095 | 0.048 |
| Sn atom concentration based on all metal elements of oxide sintered body (ppm) |  | 4442.1 | 4480.8 | 4440.2 | 4459.0 |
| Crystalline phase in oxide sintered body |  | $In_2O_3 Y_3In_2Ga_3O_{12}$ | $In_2O_3 Y_3In_2Ga_3O_{12}$ | $In_2O_3 Y_3In_2Ga_3O_{12}$ | $In_2O_3 Y_3In_2Ga_3O_{12}$ |
| Peak intensity ratio |  | 102.98 | 38.76 | 22.62 | 29.20 |
| Lattice constant of bixbyite structure (Å) |  | 10.18829 | 10.14162 | 10.14975 | 10.11010 |
| Mean particle size of $Y_3In_2Ga_3O_{12}$ (µm) |  | 1.9 | 2.6 | 2.5 | 2.4 |
| Relative density (%) |  | 99.1 | 99.1 | 98.8 | 98.8 |
| Bulk resistance (mΩ · cm) |  | 4.0 | 1.5 | 1.6 | 1.9 |

|  |  | Example 12 | Example 13 | Example 14 |
|---|---|---|---|---|
| Weight ratio of oxide | Indium oxide (% by weight) | 81.5 | 83.5 | 95.0 |
|  | Gallium oxide (% by weight) | 6.0 | 8.0 | 1.5 |
|  | Yttrium oxide (% by weight) | 12.0 | 8.0 | 3.0 |
|  | Tin oxide (% by weight) | 0.5 | 0.5 | 0.5 |
| Metal atomic ratio in oxide sintered body | In/(In + Ga + Y) | 0.775 | 0.794 | 0.941 |
|  | Ga/(In + Ga + Y) | 0.085 | 0.113 | 0.022 |
|  | Y/(In + Ga + Y) | 0.140 | 0.093 | 0.037 |
| Sn atom concentration based on all metal elements of oxide sintered body (ppm) |  | 4361.1 | 4359.3 | 4543.2 |
| Crystalline phase in oxide sintered body |  | $In_2O_3 Y_3In_2Ga_3O_{12}$ | $In_2O_3 Y_3In_2Ga_3O_{12}$ | $In_2O_3 Y_3In_2Ga_3O_{12}$ |
| Peak intensity ratio |  | 10.86 | 10.73 | 269.67 |
| Lattice constant of bixbyite structure (Å) |  | 10.16810 | 10.12196 | 10.13397 |
| Mean particle size of $Y_3In_2Ga_3O_{12}$ (µm) |  | 2.6 | 4.3 | 2.1 |
| Relative density (%) |  | 96.1 | 98.0 | 99.1 |
| Bulk resistance (mΩ · cm) |  | 3.7 | 1.8 | 4.9 |

With regard to Examples 1 to 14, even though a calcination method using the atmospheric calcination furnace under the atmosphere is a method according to which sintered body density is harder to increase than a technology using HIP (Hot Isostatic Press), spark plasma sintering (SPS) or an atmosphere calcination furnace, high-density sintered bodies in Examples 1 to 14 were able to be obtained by calcination using a simple atmospheric calcination furnace under the atmosphere.

(Measurement of Coefficient of Linear Expansion, Thermal Conductivity and Young's Modulus)

A coefficient of linear expansion, thermal conductivity and a Young's modulus were measured on the sintered bodies manufactured in Example 2 and Example 11, respectively. The results are shown in Table 3.

The coefficient of linear expansion was measured by using a sample prepared by cutting the sintered body obtained into a width of 5 mm, a thickness of 5 mm and a length of 10 mm as a standard test piece, and setting a heating rate to 10° C./min, and measuring an average coefficient of thermal expansion at 30° C. to 300° C. by means of Thermomechanical Analyzer TMA7100 (Hitachi High-Tech Science Corporation) according to a thermomechanical analysis method.

The thermal conductivity was measured by using a sample prepared by cutting the sintered body obtained into a diameter of 10 mm and a thickness of 2 mm as a standard test piece, and determining, according to a laser flash process, specific heat capacity by means of Thermal Conductivity Measurement System (made by ULVAC-RIKO, Inc., TC-9000), and thermal diffusivity by means of a thermal measuring instrument (made by Kyoto Electronics Manufacturing Co., Ltd., LFA501), and calculating by multiplying the resultant value by density determined by an external dimension and weight measurement of the test piece.

The Young's modulus was determined by using a sample prepared by cutting the sintered body obtained into a diameter of 20 mm and a thickness of 5 mm as a standard test piece, and measuring the modulus at room temperature, in air and in a plate thickness direction by means of an ultrasonic testing unit (made by Panametrics, 5900PR).

Comparative Example 1

Indium oxide powder and gallium oxide powder were weighed to be 95:5 wt % (In/(In+Ga)=0.928, Ga/(In+Ga)=0.072), respectively, and put in a pot made of polyethylene, and mixed and milled for 72 hours by using a dry ball mill to prepare mixed powder.

The resulting mixed powder was put in a mold and formed into a press-molded body at a pressure of 500 kg/cm$^2$. The resulting molded body was densified at a pressure of 2000 kg/cm$^2$ by CIP. Next, the resulting molded body was placed in an atmospheric calcination furnace, and was held at 350° C. for 3 hours under the atmosphere, and then heated at 100° C./hour, and sintered at 1430° C. for 28 hours, and then cooled by being left to stand to obtain an oxide sintered body (sintered body).

The same evaluation as in Example 1 was performed on the resulting oxide sintered body. As a result, a crystal structure of the sintered body obtained was confirmed to be only a bixbyite structure represented by In$_2$O$_3$. A lattice constant (Å) of the bixbyite structure was 10.0686 Å, relative density (%) was 96.0%, and bulk resistance was 3.6 mΩ·cm.

Moreover, a coefficient of linear expansion and thermal conductivity were evaluated on the oxide sintered body obtained in the same manner as in Example 2. The results of the coefficient of linear expansion and the thermal conductivity measured are shown in Table 3.

TABLE 3

| Use target | Example 2 | Example 11 | Comparative Example 1 |
|---|---|---|---|
| Coefficient of linear expansion [×10$^{-6}$/K] | 7.8 | 7.8 | 7.5 |
| Thermal conductivity [W/(m · K)] | 6.5 | 7.1 | 4.9 |
| Young's modulus [GPa] | 175 | 174 | — |

(Manufacture of Sputtering Target)

Sputtering targets were prepared on the sintered bodies in Examples 1 to 14, respectively.

Example 15

A film of an oxide semiconductor layer (channel layer) was formed, according to sputtering, on a silicon substrate with a thermal oxide film by using the sputtering target obtained in Example 5, and using a channel-shaped metal mask. Sputtering was performed under sputtering conditions: a sputtering pressure=1 Pa, an oxygen partial pressure=5%, and a substrate temperature=a room temperature, and a film thickness was set to 50 nm. Next, a film of a gold electrode was formed at 50 nm by using a source-drain-shaped metal mask. Finally, the resultant material was annealed under conditions of 300° C. and 1 hour in air to obtain a bottom gate and top contact simplified TFT having a channel length of 200 μm and a channel width of 1000 μm. Annealing conditions were appropriately selected in the range of 250° C. to 450° C. and 0.5 hour to 10 hours while evaluating a channel doping effect. From the results of X-ray diffraction of a thin film after annealing, the thin film was crystallized, and a crystal structure thereof was an In$_2$O$_3$-type bixbyite structure.

As a result of evaluating characteristics of the TFT obtained, mobility was 28 cm$^2$V·sec; Vth, which was a value of gate voltage at which an electric current value was more than 10$^{-8}$ A, was larger than 0.51 V; and an S value (Swing Factor) was 0.71.

INDUSTRIAL APPLICABILITY

An oxide sintered body of the invention can be utilized for a sputtering target, and the sputtering target of the invention can be utilized for manufacture of an oxide semiconductor thin film and a thin film transistor.

Several embodiments and/or Examples of the invention have been described in detail above, but those skilled in the art will readily make a great number of modifications to the exemplary embodiments and/or Examples without substantially departing from new teachings and advantageous effects of the invention. Accordingly, all such modifications are included within the scope of the invention.

The entire contents of the description of the Japanese application serving as a basis of claiming the priority concerning the present application to the Paris Convention are incorporated by reference herein.

The invention claimed is:

1. An oxide sintered body, comprising a bixbyite phase represented by $In_2O_3$, and a garnet phase represented by $Y_3In_2Ga_3O_{12}$,
   wherein the oxide sintered body has a bulk resistance of 1.5 to 9.8 mΩ·cm,
   wherein metal atomic ratios of In, Ga and Y are in the following ranges:
   0.775 or more and 0.941 or less in In/(In+Y+Ga);
   0.022 or more and 0.113 or less in Ga/(In+Y+Ga); and
   0.037 or more and 0.143 or less in Y/(In+Y+Ga).

2. The oxide sintered body according to claim 1, wherein a peak intensity ratio of maximum peak intensity of the bixbyite phase represented by $In_2O_3$ to maximum peak intensity of the garnet phase represented by $Y_3In_2Ga_3O_{12}$ is 1 to 500.

3. The oxide sintered body according to claim 1, further comprising a positive tetravalent metal element.

4. The oxide sintered body according to claim 3, wherein the positive tetravalent metal element forms solid solution with the bixbyite phase represented by $In_2O_3$ or the garnet phase represented by $Y_3In_2Ga_3O_{12}$.

5. The oxide sintered body according to claim 3, wherein a content of the positive tetravalent metal element is 100 to 10000 ppm, in terms of an atom concentration, based on all metal elements in the oxide sintered body.

6. The oxide sintered body according to claim 3, wherein the positive tetravalent metal element is Sn.

7. The oxide sintered body according to claim 1, wherein the oxide sintered body has a relative density of 96.1% to 99.4%.

8. A sputtering target, comprising an oxide sintered body
   wherein the oxide sintered body comprises a bixbyite phase represented by $In_2O_3$ and a garnet phase represented by $Y_3In_2Ga_3O_{12}$,
   wherein the oxide sintered body has a bulk resistance of 1.5 to 9.8 mΩ·cm,
   wherein metal atomic ratios of In, Ga and Y are in the following ranges:
   0.775 or more and 0.941 or less in In/(In+Y+Ga);
   0.022 or more and 0.113 or less in Ga/(In+Y+Ga); and
   0.037 or more and 0.143 or less in Y/(In+Y+Ga).

9. A method for manufacturing an oxide semiconductor thin film, comprising using a sputtering target comprising an oxide sintered body,
   wherein the oxide sintered body comprises a bixbyite phase represented by $In_2O_3$ and a garnet phase represented by $Y_3In_2Ga_3O_{12}$,
   wherein the oxide sintered body has a bulk resistance of 1.5 to 9.8 mΩ·cm,
   wherein metal atomic ratios of In, Ga and Y are in the following ranges:
   0.775 or more and 0.941 or less in In/(In+Y+Ga);
   0.022 or more and 0.113 or less in Ga/(In+Y+Ga); and
   0.037 or more and 0.143 or less in Y/(In+Y+Ga).

10. A method for manufacturing a thin film transistor comprising the oxide semiconductor thin film according to claim 9.

11. The oxide sintered body according to claim 1, wherein the metal atomic ratio of Y/(In+Y+Ga) is larger than the metal atomic ratio of Ga/(In+Y+Ga) of Ga.

12. A method for manufacturing an oxide semiconductor thin film, comprising using a sputtering target comprising an oxide sintered body,
   wherein the oxide sintered body comprises a bixbyite phase represented by $In_2O_3$ and a garnet phase represented by $Y_3In_2Ga_3O_{12}$, and wherein the oxide sintered body comprises:
   a weight ratio of indium oxide is at or between 81.5% and 95%;
   a weight ratio of gallium oxide is at or between 1.5% and 8%;
   a weight ratio of yttrium oxide is at or between 3% and 12%; and
   a weight ratio of tin oxide is at or between 0% and 0.5% and the oxide sintered body has a bulk resistance of 1.5 to 9.8 mΩ·cm.

* * * * *